US009916942B2

United States Patent
Shedletsky

(10) Patent No.: US 9,916,942 B2
(45) Date of Patent: Mar. 13, 2018

(54) SEALED BUTTON FOR AN ELECTRONIC DEVICE

(71) Applicant: Apple Inc., Cupertino, CA (US)

(72) Inventor: Anna-Katrina Shedletsky, Mountainview, CA (US)

(73) Assignee: Apple Inc., Cupertino, CA (US)

(*) Notice: Subject to any disclaimer, the term of this patent is extended or adjusted under 35 U.S.C. 154(b) by 1 day.

(21) Appl. No.: 14/917,552

(22) PCT Filed: Sep. 10, 2013

(86) PCT No.: PCT/US2013/059014
§ 371 (c)(1),
(2) Date: Mar. 8, 2016

(87) PCT Pub. No.: WO2015/038098
PCT Pub. Date: Mar. 19, 2015

(65) Prior Publication Data
US 2016/0225551 A1  Aug. 4, 2016

(51) Int. Cl.
*H01H 13/06* (2006.01)
*H03K 17/96* (2006.01)
*H03K 17/965* (2006.01)

(52) U.S. Cl.
CPC ........... *H01H 13/06* (2013.01); *H03K 17/965* (2013.01); *H03K 17/9625* (2013.01); *H01H 2215/004* (2013.01)

(58) Field of Classification Search
CPC ................................ H01H 13/06; H03K 17/9625
(Continued)

(56) References Cited

U.S. PATENT DOCUMENTS 4,267,725 A * 5/1981 Roth ................... G01L 1/2206
200/408
6,023,033 A * 2/2000 Yagi .................... H01H 13/705
200/341
(Continued)

FOREIGN PATENT DOCUMENTS

| CN | 103567634 | * 2/2014 | ............ B23K 26/21 |
|---|---|---|---|
| DE | 102012009039 | 11/2013 | |
| EP | 1983803 | 10/2008 | |

OTHER PUBLICATIONS

Invitation to Pay Additional Fees dated May 16, 2014, PCT/US2013/059014, 6 pages.
(Continued)

*Primary Examiner* — Edwin A. Leon
*Assistant Examiner* — Iman Malakooti
(74) *Attorney, Agent, or Firm* — Brownstein Hyatt Farber Schreck, LLP

(57) ABSTRACT

One embodiment of the disclosure includes an electronic device including an enclosure (214), a button (106), and a processing element (not shown). The button is connected to the enclosure and includes a button cap (234) defining a user input surface, a flexible member (238) having an interior surface (270) and exterior surface. The flexible member is aligned with the button cap and is connected thereto. The button further includes a strain sensor (244) connected to the interior surface of the flexible member, the strain sensor is in communication with the processing element. When a force is exerted on the button cap, the flexible member bends and the strain sensor detects a user input corresponding to the force and provides a signal to the processing element corresponding to the user input. In some embodiments, the button may be substantially or completely waterproof.

20 Claims, 15 Drawing Sheets

(58) Field of Classification Search
USPC .............................................. 200/5 A, 302.2
See application file for complete search history.

(56) References Cited

U.S. PATENT DOCUMENTS

| | | | |
|---|---|---|---|
| 6,731,219 B1 | 5/2004 | Wheat et al. | |
| 7,191,662 B2 | 3/2007 | Weber et al. | |
| 8,124,900 B2* | 2/2012 | Ruppert | H01H 13/14 |
| | | | 200/341 |
| 8,619,062 B2 | 12/2013 | Powell et al. | |
| 8,847,895 B2 | 9/2014 | Lim et al. | |
| 2010/0108486 A1* | 5/2010 | Yoshida | H01H 13/85 |
| | | | 200/520 |
| 2011/0073454 A1* | 3/2011 | Chen | H01H 13/704 |
| | | | 200/5 A |
| 2012/0256867 A1 | 10/2012 | Annacone | |

OTHER PUBLICATIONS

International Search Report and Written Opinion dated Aug. 12, 2014, PCT/US2013/059014, 15 pages.
Second Written Opinion dated Jun. 12, 2015, PCT/US2013/059014, 7 pages.

* cited by examiner

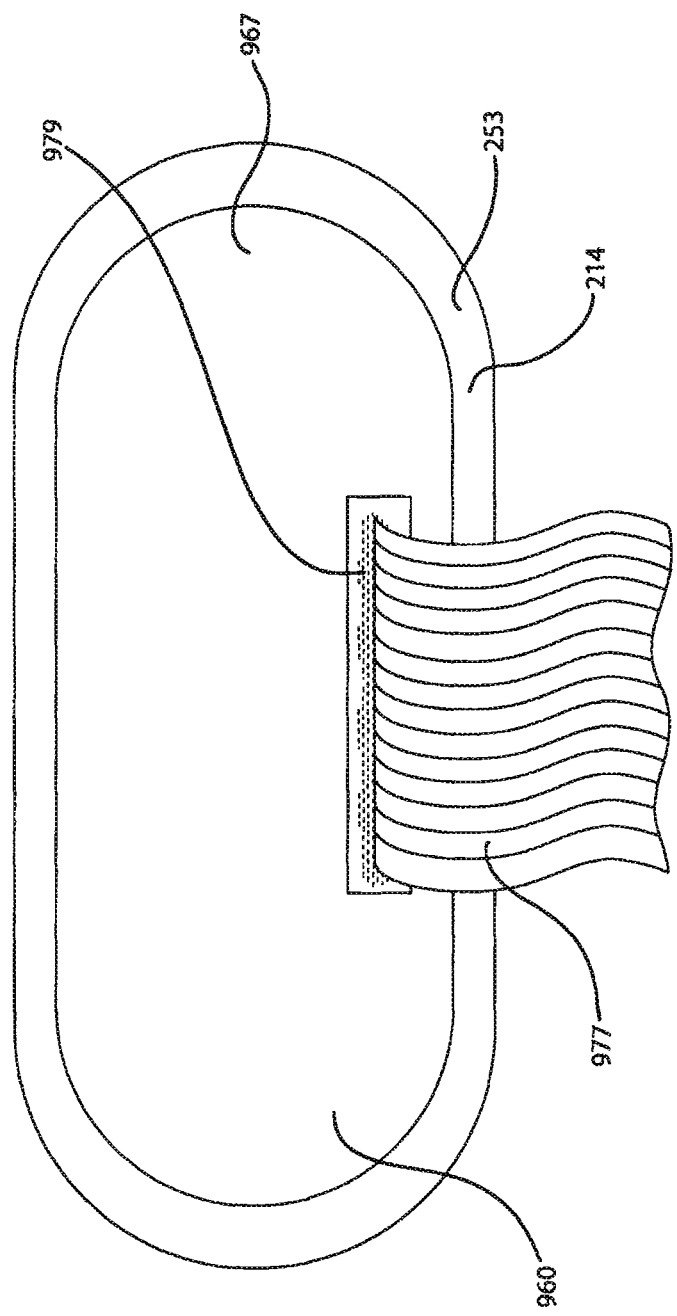

SEALED BUTTON FOR AN ELECTRONIC DEVICE

CROSS REFERENCE TO RELATED APPLICATION

This application is a 35 U.S.C. § 371 application of PCT/US2013/059014, filed on Sep. 10, 2013, and entitled "Sealed Button for an Electronic Device," which is incorporated by reference as if fully disclosed herein.

TECHNICAL FIELD

The present invention relates generally to electronic devices, and more specifically, to input devices for computing devices.

BACKGROUND

Many types of electronic devices, such as smart phones, gaming devices, computers, watches, and the like, include input devices, such as buttons or switches to receive user input. Often, these input buttons or switches may include a tactile element to provide feedback to a user as he or she provides input to the button. However, as electronic devices become smaller, space available for buttons and switches, especially those that compress, becomes smaller. Moreover, many buttons and switches for electronic devices may require movable or electronic components and thus require sealing elements to prevent fluids or the like from entering into the enclosure and damaging the electrical components. These sealing elements may increase the size of the space required for the button or may not seal effectively. Therefore, there is a need for buttons and switches that can provide input for electronic devices that can operate in a reduce area and seal the enclosure.

SUMMARY

One example of the present disclosure includes an electronic device including an enclosure, a button, and a processing element. The button is connected to the enclosure and includes a button cap defining a user input surface, a flexible member having an interior surface and exterior surface. The flexible member is aligned with the button cap and is connected thereto. The button further includes a strain sensor connected to the interior surface of the flexible member, the strain sensor is in communication with the processing element. When a force is exerted on the button cap, the flexible member bends and the strain sensor detects a user input corresponding to the force and provides a signal to the processing element corresponding to the user input. In some embodiments, the button may be substantially or completely waterproof.

Another example of the disclosure includes a waterproof button. The waterproof button includes a button cap configured to move between a first position and a second position in response to a user input force. The waterproof button also includes an at least partially flexible metal plate aligned with the button cap and a strain sensor directly connected to a first surface of the flexible metal plate. The strain sensor includes a flexible circuit and a strain gauge connected to the flexible circuit. In use, the flexible metal plate bends in response to a user input force applied to the button cap, deforming the flexible circuit and the strain gauge.

Yet another example of the disclosure includes a waterproof button for an electronic device. The waterproof button includes a user input element, a flexible member aligned with the user input element, and a strain sensor defined on the flexible member, the strain sensor includes a strain gauge and is the strain sensor is deposited directly onto the flexible member.

BRIEF DESCRIPTION OF THE DRAWINGS

FIG. 15 is a bottom plan view of the sealing member and flexible member of FIG. 14.

SPECIFICATION

Overview

Figure 1:
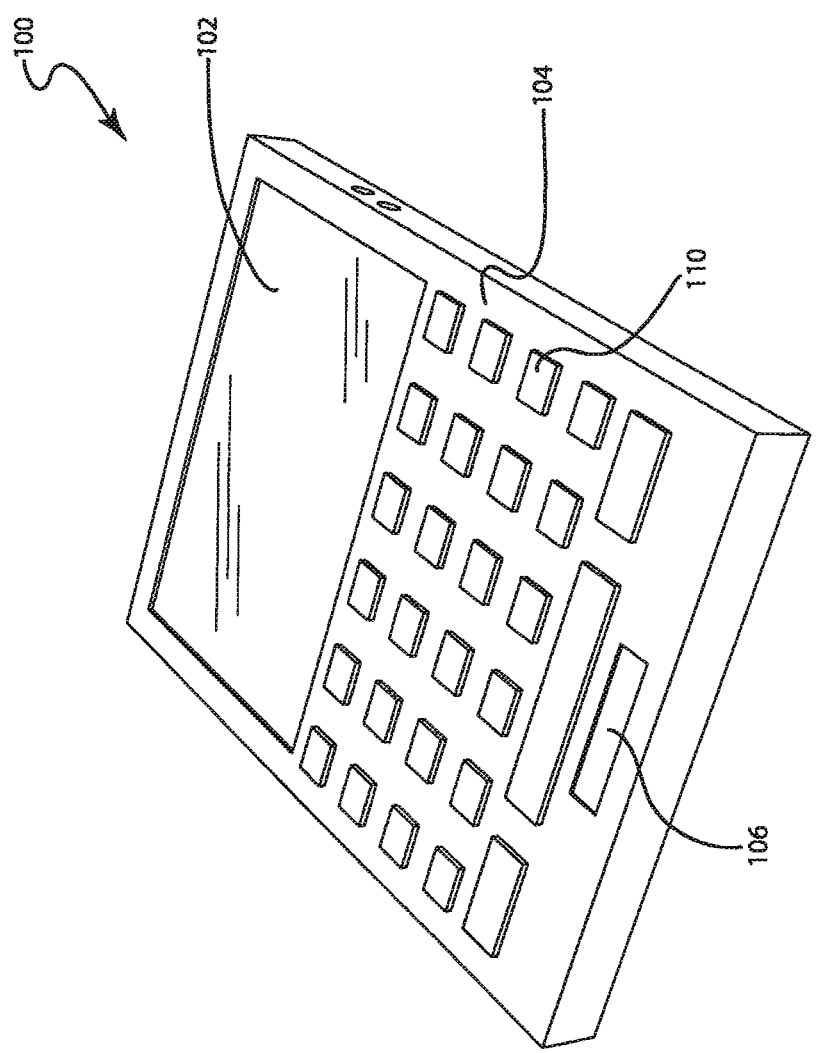
FIG. 1 is a front perspective view of a first example of an electronic device including a waterproof button.

Some embodiments herein include a compact electronic device, such as a wearable electronic device, smart phone, portable music player, gaming device, or the like, including a waterproof button. The waterproof button can be compressed to provide user input to the electronic device, even under water, without allowing water or other fluids to enter into the electronic device. In some embodiments, the waterproof button may not require a membrane, such as a rubber gasket, or one or more O-rings, and may still substantially prevent water from entering into the electronic device, even as the button is compressed or otherwise selected. For example, in some embodiments the electronic device may be a watch or other wearable item and the waterproof button may be connected to a sidewall of the watch. In this example, the button may be compressed by a user and move towards the sidewall of the watch as it is compressed. Although the button may move vertically or horizontally relative to the enclosure, the button is configured provide an electrical signal to the electronic device corresponding to the movement, while water may be prevented from entering into the electronic device through the button or around the button.

In some embodiments, the waterproof button may include a button cap including a force collector, a flexible member, and a strain sensor mounted to or otherwise connected to the flexible member. The button cap extends at least partially outwards from a sidewall of an enclosure for the electronic device and can be compressed by a user. The force collector may be a nub or extension connected to the bottom of the button cap and the flexible member is connected to or mounted beneath the force collector. A circuit element including a strain sensor is connected to an opposite side of the flexible member from the force collector. In operation, a user presses onto the outer surface of the button cap, causing the button cap to move relative to the enclosure. The force then is collected by the force collector into a reduce area, i.e., focused or aggregated, and transferred to the strain sensor via the flexible member. In particular, as button cap compresses, the force collector presses against the flexible member, causing the flexible member to bend or otherwise deform. The deformation of the flexible member at least partially deforms the circuit element or otherwise causes the strain sensor to detect the user force to the button.

The flexible member may be a separate element sealingly attached to the enclosure or housing. Alternatively, the flexible member can be a living hinge formed integrally with the enclosure, such as a thinned portion of a sidewall that is flexible. In many embodiments, the flexible member acts to seal the internal components of the electronic device from the environment surrounding the enclosure. For example, the flexible element may prevent water from entering into the cavity defined by the enclosure, even as the button is compressed. As another example, the flexible element and button cap may be integrally formed. In this example, the button cap and flexible element may be formed in the enclosure or a portion of the enclosure. The button cap and flexible element may have sufficient flexibility so as to at least partially deform or bend in response to a user input force. The deformation of the button cap and flexible element together allow the strain sensor to register the user input to the button cap. In this embodiment, the force collector may be omitted or may be formed integrally with the button cap and flexible element.

The waterproof button may also include a feedback element. For example, a collapsible dome or a tactile element can be positioned between the button cap and the flexible member. In this example, the force collector may be connected to a bottom surface of the dome. In operation, as a force is exerted on the button cap, the force is transmitted to the dome, which collapses (at least in part) to provide tactile feedback to the user. The force collector on the bottom of the dome then exerts a force against the flexible member, which causes the flexible member to deform so that the strain sensor can detect the input force.

In some embodiments, the waterproof button may further include a sealing plate. The sealing plate may be included in embodiments where the flexible member may not extend between the sidewalls of the enclosure. The sealing plate may be connected on an interior of the enclosure and at least partially surrounds the button cap, the strain sensor, and the flexible member. For example, the sealing plate may act as a lid for the elements of the button assembly positioned on the interior surface of the enclosure. Alternatively or additionally, the waterproof button may include an O-ring or sealing material (e.g., soft polymer) positioned around the button cap and/or force collector.

Turning now to the figures, an illustrative electronic device including the waterproof button will now be discussed. FIG. 1 is a perspective view of an electronic device 100 including a screen 102, an enclosure 104 substantially surrounding the screen 102, a plurality of input buttons 110, and a waterproof button 106. In the embodiment illustrated in FIG. 1, the electronic device 100 is a smart phone. However, the electronic device may be substantially any type of electronic device that includes user input.

The screen 102 may be substantially any type of component that displays visual output. For example, the screen 102 may be a liquid crystal display (LDC), a plasma display, or the like. The screen 102 may also include one or more input sensors, such as a multi-touch sensors, or the like that may detect user input to the screen 102.

The enclosure 104 surrounds the screen 102 as well as one or more of the input buttons 110 and/or the waterproof button 106. The enclosure 104 generally acts as a housing to protect the internal components of the electronic device 100 and provides a case for the electronic device.

The one or more input buttons 110 allow a user to input data to the electronic device 100. For example, the one or more inputs buttons 110 may include keys including glyphs that correspond to particular inputs. In this example, in the input buttons may form a keyboard, number pad, or command buttons.

The waterproof button 106 provides user input to the electronic device 100. In many embodiments, the waterproof button 106 may be a mechanical component that is physically altered (e.g., moved) by a user and then provides an electronic signal to a processing element corresponding to the user input. The waterproof button 106 will be discussed in more detail below, but generally may be activated by a user without allowing water, fluid, or debris from entering into the electronic device. Although the input buttons 110 have been shown as separate from the waterproof button 106, in some embodiments, each of the buttons for the electronic device 100 may be waterproof, which may allow the device 100 to be better protected from damage in certain environments.

Figure 2:
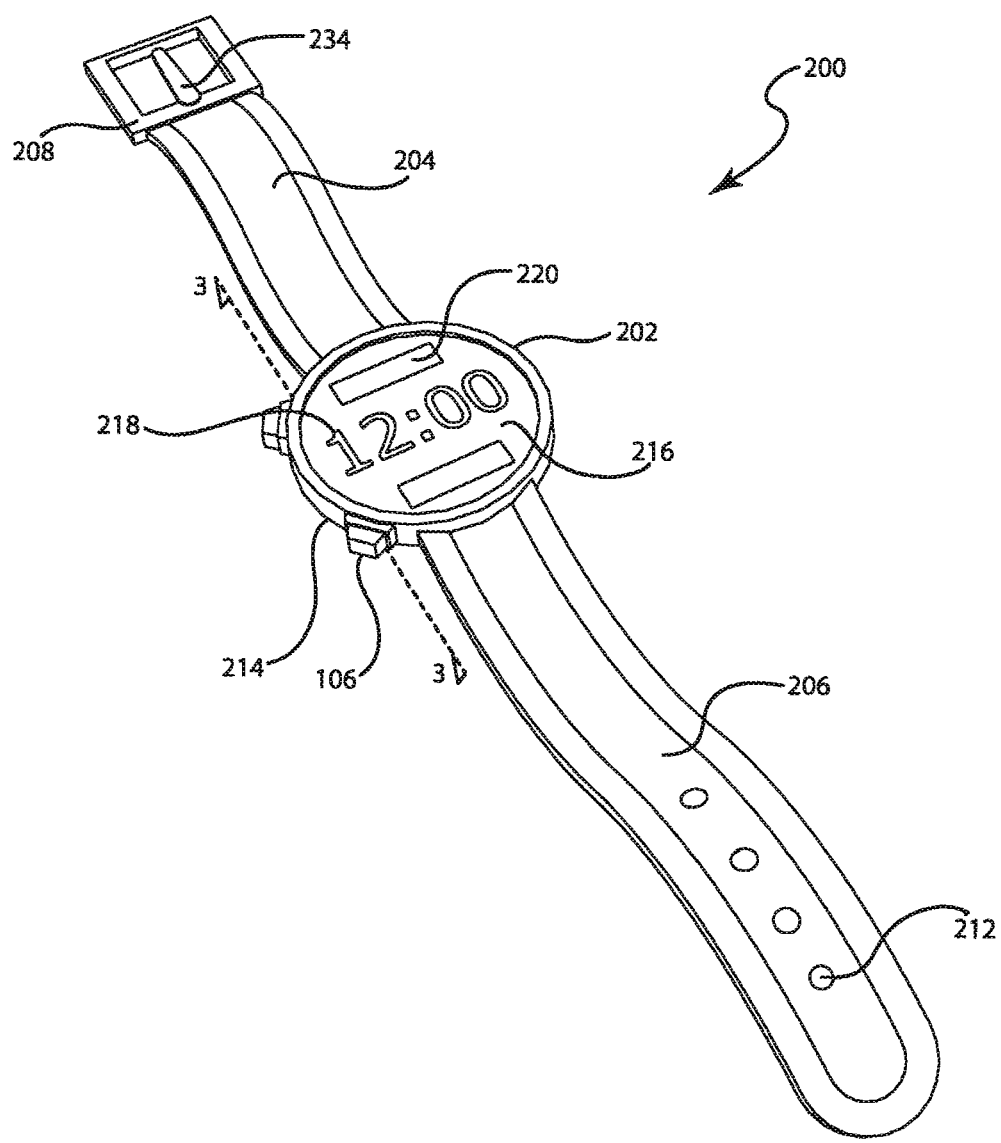
FIG. 2 is a front elevation view of a second example of an electronic device including the waterproof button.

In other embodiments, the waterproof button 106 may be incorporated into a wearable electronic device. FIG. 2 is a top perspective view of a wearable electronic device including the waterproof button 106. The wearable electronic device 200 may include a hub 202 or computing center. In embodiments where the electronic device 200 is configured to be worn by a user, the device 200 may include one or more straps 204, 206 that may connect to opposite sides of the hub 202. Each of the straps 204, 206 may wrap around a portion of a wrist, arm, leg, chest, or other portion of a user's body to secure the hub 202 to the user. For example, the ends of each of the straps 204, 206 may be connected together by a fastening mechanism 208. The fastening mechanism 208 can be substantially any type of fastening device, such as, but not limited, to, hook and loop, magnetic fasteners, snaps, buttons, clasps or the like. However, in one embodiment, such as the one shown in FIG. 2, the fastening mechanism 208 is a buckle including a prong 234 or other element that can be inserted into one or more apertures 212 in the second strap 206 to secure the first and second straps 204, 206 together.

The hub 202 of the wearable electronic device generally contains the computing and processing elements of the wearable electronic device 200. The hub 202 may include a display 216 at least partially surrounded by an enclosure 214. In some embodiments, the display 216 may form a face of the hub 202 and the enclosure 214 may wrap around the edges and backside of the display 216.

Figure 3:
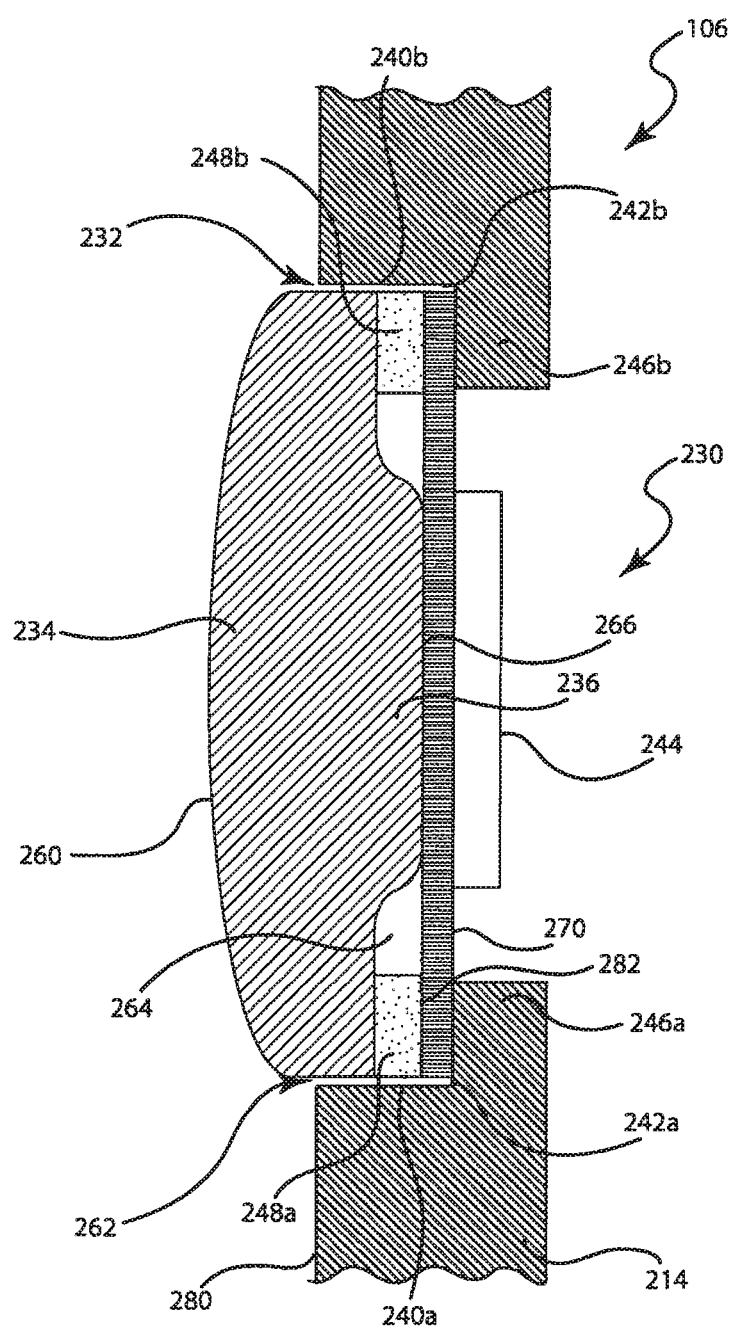
FIG. 3 is a cross-section view of the waterproof button taken along line 3-3 in FIG. 2.

FIG. 3 is an enlarged cross-section view of the wearable electronic device 200 taken along line 3-3 in FIG. 2. With reference to FIGS. 2 and 3, the internal components of the wearable device 200 may be contained within a cavity 230 defined by the enclosure 214 and the display 116. The enclosure 214 protects the internal components of the hub 202, as well as connects the display 216 to the hub 202.

The enclosure 214 may be constructed out of a variety of materials, such as, but not limited to, plastics, metals, alloys, and so on. The enclosure 214 includes a button aperture 232 (see FIG. 3) that receives at least a portion of the waterproof button 106. The button aperture 232 defines a gap between two sidewalls 240a, 240b of the enclosure 214. Additionally, in some embodiments, the button aperture 232 may vary in diameter from a top surface of the enclosure 214 towards the interior of cavity 230. For example, a top portion of the enclosure may form a recess 242a, 242b on either side of the button aperture 232 and a bottom portion of the enclosure may extend in towards the center of the button aperture 232 to define a ledge 246a, 246b on either side of the button aperture 232. The ledges 246a, 246b reduce the size of the button aperture 232 as they extend further inwards than the sidewalls 240a, 240b defining the top of the button aperture 232.

With reference to FIGS. 2 and 3, the display 216 may be connected to the enclosure 214 through adhesive or other fastening mechanisms. In this example, the display 216 is seated within a recessed portion or groove of the enclosure 214 and the enclosure 214 wraps around the edges of the display 216. However, in other embodiments, the display and enclosure may be otherwise connected together.

The display 216 may be similar to the display 102 and may be substantially any type of display screen or device that can provide a visual output for the wearable device 200. As an example, the display 216 may be a LCD display, a light emitting diode display, or the like. Additionally, the display 216 may also be configured to receive a user input, such as a multi-touch display screen that receives user inputs through capacitive sensing elements. In many embodiments, the display 216 may be dynamically variable; however, in other embodiments, the display 216 may be a non-electronic component, such as a painted faceplate including numbers (e.g., watch face), that may not dynamically change.

The display 216 presents a plurality of icons 218, 220 or other graphics that are selectively modifiable. As an example, a first graphic 218 may include a time graphic that changes its characters to represent the time changes, e.g., numbers to represent hours, minutes, and seconds. A second graphic 220 may include a notification graphic, such as, battery life, messages received, or the like. The two graphics 218, 220 may be positioned substantially anywhere on the display 216 and may be varied as desired. Additionally, the number, size, shape, and other characteristics of the graphics 218, 220 may be changed as well.

The waterproof button 106 extends from and attaches to the enclosure 214. The water proof button 106 will be discussed in more detail below, but generally allows a user to provide input to the wearable electronic device 200, as well can provide haptic feedback to a user.

Figure 4:
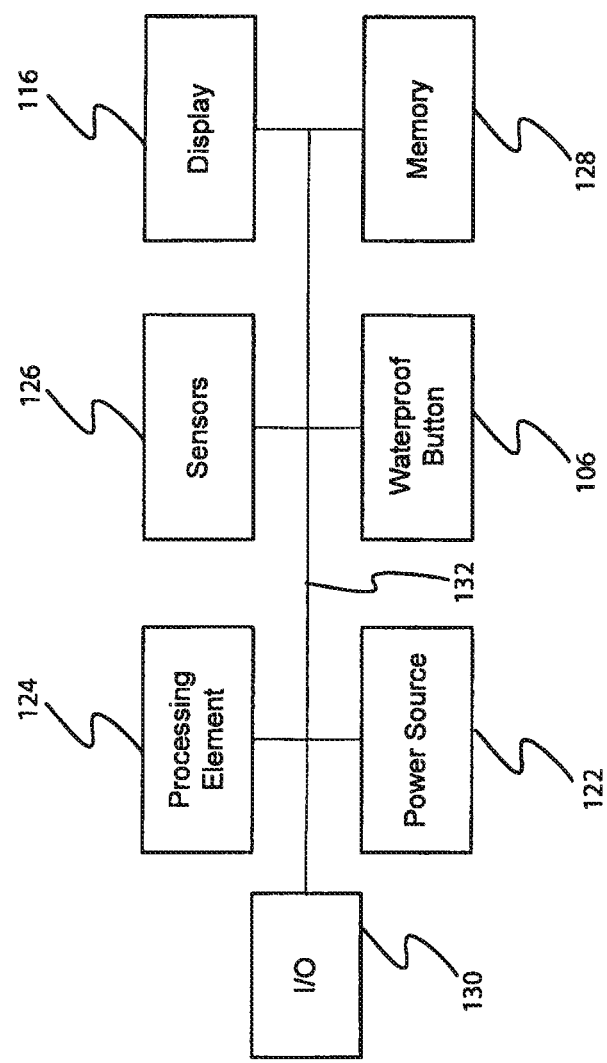
FIG. 4 is a simplified block diagram of the electronic device including the waterproof button.

With reference to FIG. 4, various embodiments of the electronic device 100, 200 include a plurality of internal processing or computing elements. For example, the electronic devices 100, 200 may include a power source 122, one or more processing elements 124, a memory component 128, one or more sensors 126, and an input/output component 130. Each of the internal components may be received within the enclosure 104, 214 and may be in communication through one or more systems buses 132, traces, printed circuit boards, or other communication mechanisms.

The power source 122 provides power to the components of the electronic device 100, 200. The power source 122 may be a battery or other portable power element. Additionally, the power source 122 may be rechargeable or replaceable.

The processing element 124 or processor is substantially any type of device that can receive and execute instructions. For example, the processing element 124 may be a processor, microcomputer, or the like. Additionally, the processing element 124 may include one or more processors and in some embodiments may include multiple processing elements.

The one or more sensors 126 may be configured to sense a number of different parameters or characteristics that may be used to influence one or more operations of the electronic device 100, 200. For example, the sensors 126 may include accelerometers, gyroscopes, capacitive sensors, light sensors, image sensors, pressure or force sensors, or the like. As will be discussed in more detail below, one or more of the sensors 126 may be used in conjunction with the input button 110 or separate therefrom, to provide user input to the electronic device 100, 200.

With continued reference to FIG. 4, the memory component 128 stores electronic data that may be utilized by the electronic device 100, 200. For example, the memory component 128 may store electrical data or content e.g., audio files, video files, document files, and so on, corresponding to various applications. The memory 128 may be, for example, non-volatile storage, a magnetic storage medium, optical storage medium, magneto-optical storage medium, read only memory, random access memory, erasable programmable memory, or flash memory.

The input/output interface 130 may receive data from a user or one or more other electronic devices. Additionally, the input/output interface 130 may facilitate transmission of data to a user or to other electronic devices. For example, the input/output interface 130 may be used to receive data from a network, or may be used to send and transmit electronic signals via a wireless or wired connection (Internet, WiFi, Bluetooth, and Ethernet being a few examples). In some embodiments, the input/output interface 130 may support multiple network or communication mechanisms. For example, the network/communication interface 130 may pair with another device over a Bluetooth network to transfer signals to the other device, while simultaneously receiving data from a WiFi or other network.

The waterproof button 106 will now be discussed in more detail. With reference again to FIG. 3, the waterproof button 106 may include a button cap 234, a force collector 236, a flexible member 238, and a strain sensor 244. The waterproof button 106 is connected to the enclosure 214 or housing and seals the cavity 230 from water and debris.

The button cap 234 forms the exterior surface of the waterproof button 106 and as such may include a cosmetic or aesthetically appealing surface, structure, or appearance. The button cap 234 forms a user input element. In particular, to provide input to the waterproof button 106 the user compresses the top surface of the button cap 234. In some embodiments the button cap 234 may have a rounded top surface 260 with straight sidewalls. The button cap 234 may be constructed out of a variety of materials and may include one or more coatings, paint layers, or the like. As some non-limiting examples, the button cap 234 may be ceramic, metal, plastic, metal alloys, or the like.

A force collector 236 extends from a bottom surface of the button cap 234. In some embodiments, the force collector 236 may be integrally formed with the button cap 234. However, in other embodiments, the force collector 236 may be a separate component attached to the button cap 234. In many embodiments, the force collector 236 may have a reduced width as compared to a bottom surface 264 of the button cap 234. For example, a bottom surface 266 of the force collector 236 has a smaller surface area than the top surface 260 of the button cap 234. The force collector 236 may taper as it extends away from the bottom surface 264 of the button cap 234. In embodiments where the force collector 236 is integrally formed with the button cap 234, in cross-section, the button cap 234 may have a mushroom shape with the force collector 236 forming the trunk of the mushroom an the button cap 234 extending past the edges of the force collector 236 to define a head of the mushroom shape.

The flexible member 238 transfers force experienced by the button cap 234 to the force sensor 244. The flexible member 238 forms a plate and is sufficiently thin and/or is comprised of a resilient material so as to be at least somewhat flexible. For example, in one embodiment the flexible member 238 may be a stainless steel plate that is thinned so as to bend in response to a user input. As some examples, the flexible member 238 may bend in response to a user applied force between 10 to 50 grams, and as a specific example, 20 grams. However, in other embodiments, the flexible member 238 may be formed from other materials, such as plastics or the like. The flexible member 238 may also be sufficiently rigid to transmit force from the force collector 236 and support the button cap 234. The flexible member 238 may be formed integrally with the housing or enclosure 214 or may be a separate component.

Figure 5:
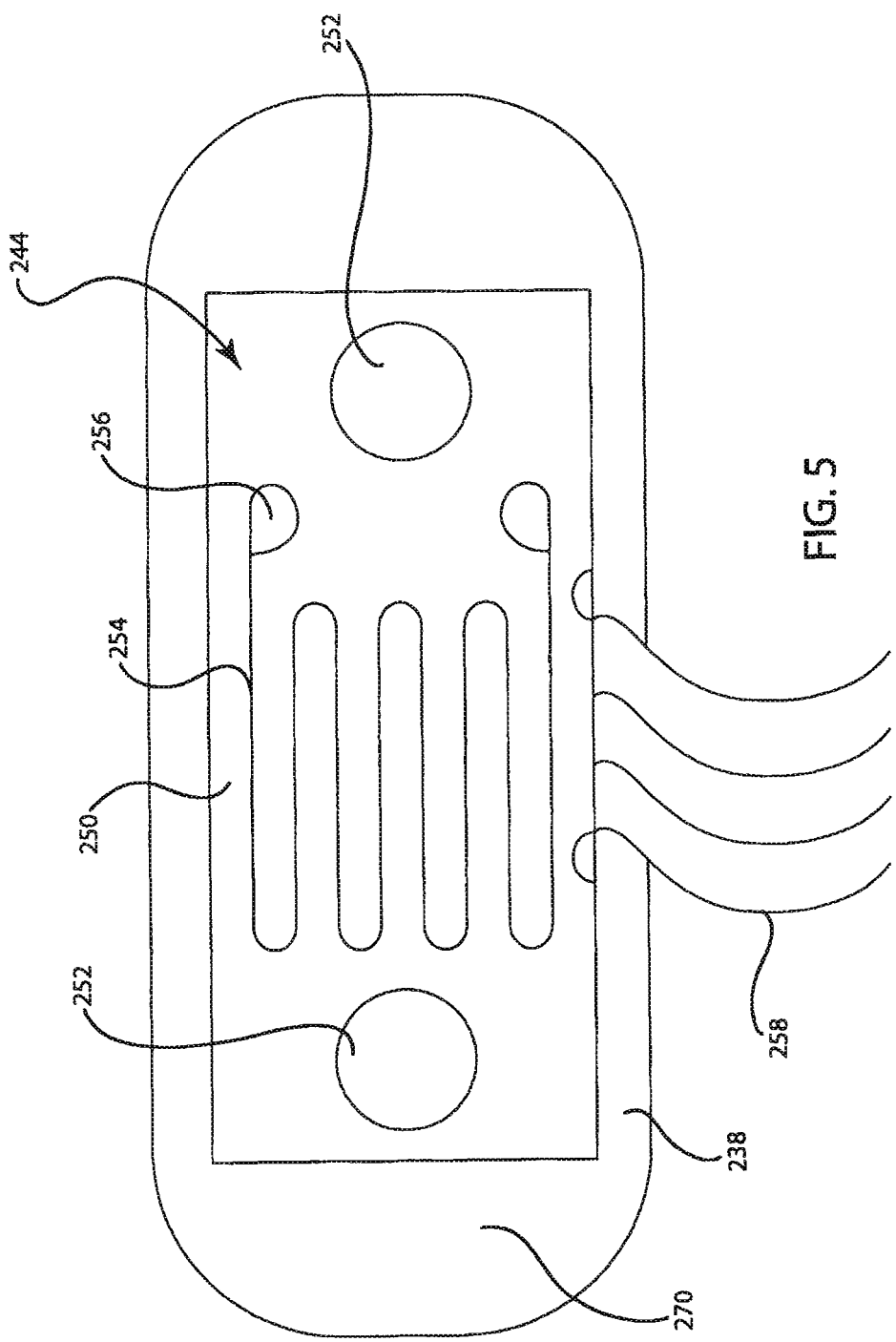
FIG. 5 is a bottom plan view of a flexible member and strain sensor for the waterproof button of FIG. 3.

The strain sensor 244 detects deformation of the flexible member 238 and produces an electrical signal. FIG. 5 is a bottom plan view of the waterproof button 106 illustrating the strain sensor 244. With reference to FIG. 5, the strain sensor 244 may include a strain gauge 250 including a strain sensitive pattern 254 and two terminals 256 connected to the strain sensitive pattern 254. The strain sensitive pattern 254 is configured to change at least one electrical property in response to a deformation, e.g., increasing or decreasing resistance, and the two terminals 256 provide an electrical signal output.

The strain gauge 250 is electrically connected to a flexible connector 258, such as a flexible circuit (flex) that electrically connects the strain gauge 250 to the processing element 124 of the electrical device 100, 200. As one example, the connector 258 may be a flexible plastic substrate, such as, but not limited to, polyimide, polyether ether ketone (PEEK), or transparent conductive polyester film. The flexible connector 258 forms a substrate for the strain gauge 250 and transfers a bending force to the strain gauge.

With reference to FIGS. 3 and 5, assembly of the waterproof button 106 will now be discussed in more detail. The strain element 250 is connected to the flexible connector 258, such as through adhesive, or the like. Alternatively, the strain element 250 may be screen printed, deposited, or otherwise formed on the connector 258 to form the strain sensor 244. The strain sensor 244 is then connected at connection points 252 to a bottom surface 270 the flexible member 238. In some embodiments, the strain sensor 244 is welded at weld points to the flexible member 238. Because the strain gauge 250 is mounted to the flexible connector 258, which is then attached directly to the flexible member 238, strain from the flexible member 238 may be directly transferred to the strain sensitive pattern. In particular, by mounting the strain gauges 250 to the connector 258, such as a flex circuit, prior to mounting the connector to the flexible member 238, allows the strain gauge to be more easily mounted to the flexible member 238 in a manner that may sufficiently transfer bending motion between the two elements. In some instances, strain gauges can be difficult to mount in order to sufficiently transfer strain from the measured item to the strain gauge. However, in this embodiment, the flexible connector 258 is welded to the flexible member 238 and therefore stretches with the flexible member 238, stretching the strain gauge 250 correspondingly. However, other attachment mechanisms may be used that connect the strain sensor 244 to the flexible member 238 as long as the attachment allows for strain experienced by the flexible member 238 to be transferred to the strain gauge 250.

Once the strain sensor 244 is connected to the flexible member 238, the flexible member 238 is connected to the enclosure 214. In particular, with reference to FIG. 3, the flexible member 238 spans the diameter of the button aperture 232 and sits on the top surface of the ledge 246a, 246b extending into the button aperture 232. The flexible member 238 may have a sufficiently large width so as to be positioned adjacent the sidewalls 240a, 240b and the ledges 246a, 246b may extend underneath a portion of the flexible member 238. In this manner, the ledges 246a, 246b support the ends of the flexible member 238 as it spans across the button aperture 232. The flexible member 238 is connected to the ledges 246a, 246b in a variety of different manners, such as, but not limited to, adhesive, welding, bonding, or the like. The connection method used may depend on the material used for the enclosure 214 and the flexible member 238. However, in embodiments where the flexible member 238 is welded to the enclosure, the welding may create a hermetical seal and may prevent the transmission of air, as well as fluids, therebetween. In other embodiments, adhesive, such as pressure sensitive adhesive or liquid glue may be used to connect the flexible member 238 to the enclosure. In these embodiments, pressure that may be exerted on the flexible member from an exterior of the electronic device (e.g., water pressure when the electronic device is positioned under water) may increase the sealing force between the flexible member and the enclosure.

As the flexible member 238 extends past the button aperture 232 and sits on the ledges 246a, 246, the flexible member 238 substantially prevents water, fluid, and other debris from entering into the cavity 230. In other words, the flexible member 238, which may be non-porous, acts as a seal or lid for the button aperture 232 and prevents water from entering through the button aperture 232 into the cavity 230.

Once the flexible member 238 is connected to the enclosure 214, the button cap 234 may be connected to the flexible member 238. In particular, with continued reference to FIG. 3, the force collector 236 may be aligned with a location opposing the location of the strain sensor 244 on the bottom 270 of the flexible member 238. The bottom 266 of the force collector 236 may be positioned on the top surface of the flexible member 238. Adhesive 248a, 248b may be positioned on the bottom 264 of the button cap 234 on either side of the force collector 236. The adhesive 248a, 248b extends between the bottom 264 of the button cap 234 and the top of the flexible member 238. The adhesive 248a, 248b secures the button cap 234 to the flexible member 238 and therefore attaches the button cap 234 to the enclosure 214 via the flexible member 238. The top surface 260 of the button cap 234 may extend past the top surface 280 of the enclosure 214 or may be flush or recessed from the top surface 280 of the enclosure 214.

Figure 6:
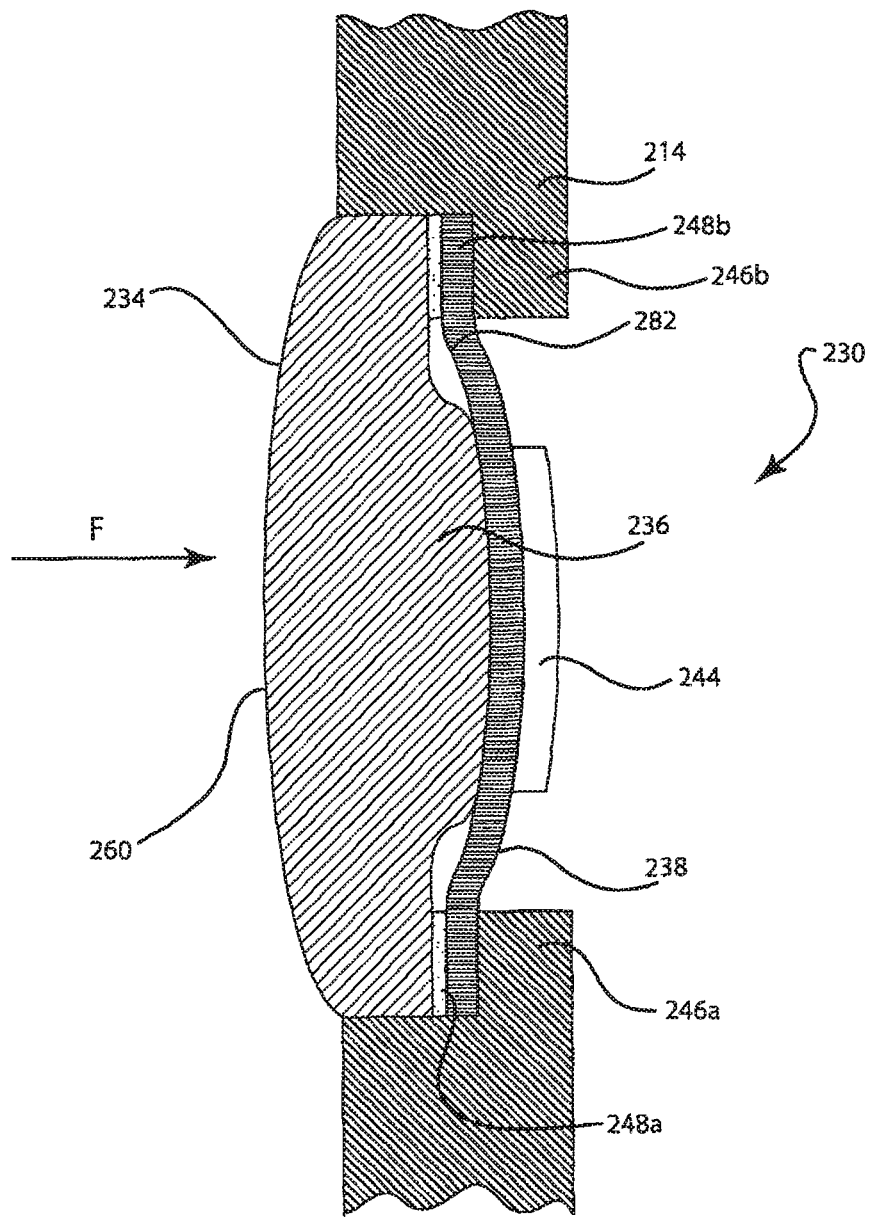
FIG. 6 is a cross-section view of the waterproof button of FIG. 3 as a user input force is applied thereto.

Operation of the waterproof button 106 will now be discussed in more detail. FIG. 6 is a cross-section view of the waterproof button 106 as a force is exerted on the button cap. With reference to FIG. 6, as a user provides a force F to the top surface 260 of the button cap 234, the force is transmitted from the top surface 260 to the force collector 236. The force collector 236 aggregates the force applied to the top surface 260 and transmits the force to the flexible member 238. As the force F is transmitted to the flexible member 238, the flexible member 238 deforms. In other words, the flexible member 238 acts as a beam and withstands the load by bending. In particular, in this example, the top surface 282 of the flexible member 238 experiences a compression force and the bottom surface 270 experiences a tension force. Because the strain sensor 244 is welded (or otherwise directly connected) to the flexible member 238, the strain sensor 244 experiences the same force experienced by the flexible member 238. For example, because the strain sensor 244 is mounted to the bottom surface 270 of the flexible member 238, the strain sensor 244 experiences the tension experienced by the button surface 270 in response to the force. The tension causes the strain sensitive pattern 254 to stretch, varying the electrical signal output through the terminals 256. The signal is then provided via the connector 258 to the processing element 124, which registers the user input to the waterproof button 106.

Additional Examples

Figure 7:
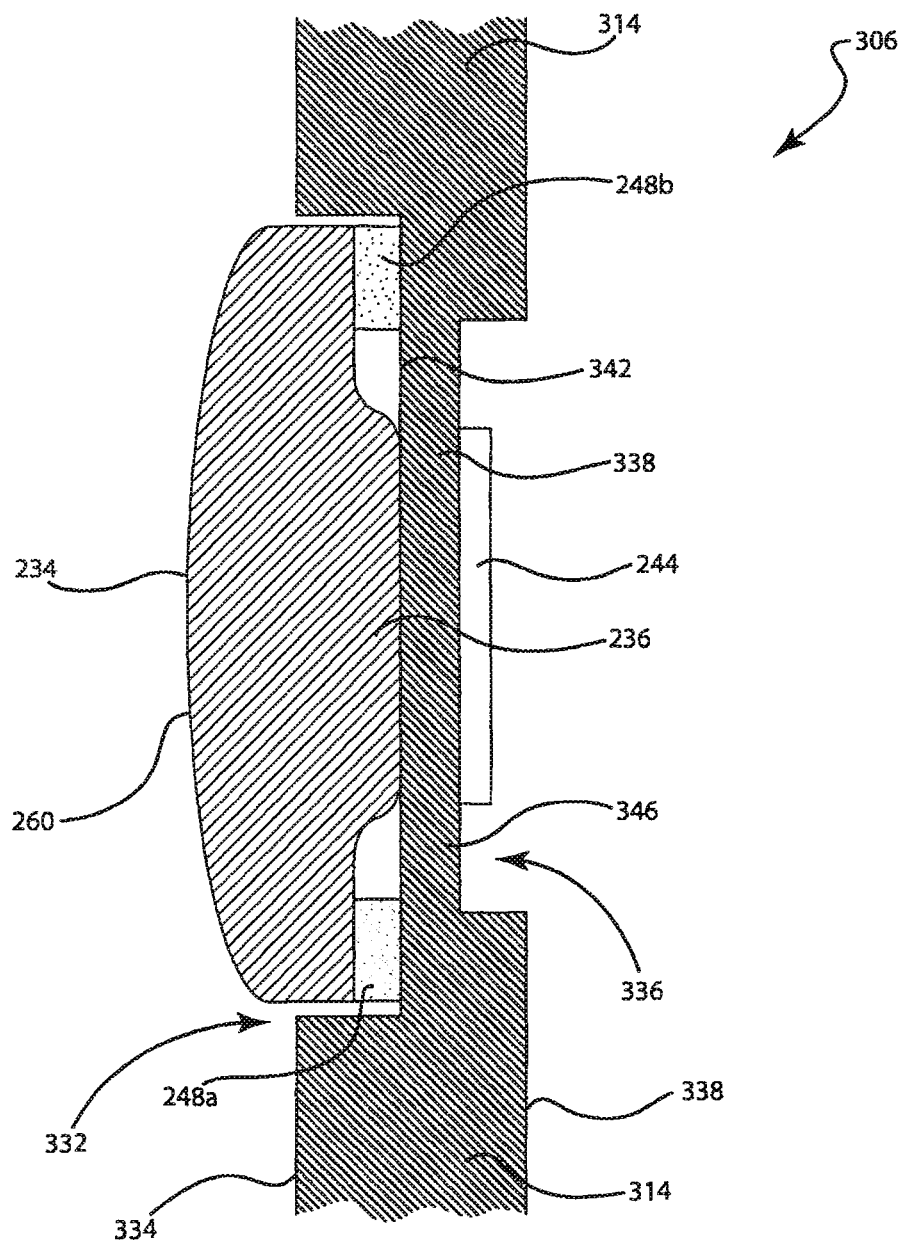
FIG. 7 is a cross-section view of a first example of the waterproof button including an integrally formed housing and flexible member.

As briefly mentioned above, in some embodiments, the flexible member may be formed integrally with the housing. FIG. 7 is a cross-section view of another embodiment the waterproof button including a flexible member that is integrally formed with the enclosure. With reference to FIG. 7, in this example, the waterproof button 306 may be substantially similar to the waterproof button 106, but the flexible member 338 may be formed integrally with the housing. In particular, the enclosure 314 includes a thinned portion 346 having a thickness that is less than a thickness of other areas of the enclosure 314. The thinned portion 346 forms a living hinge to define the flexible member 338. The thickness of the thinned portion 346 may be sufficiently thin to allow the flexible member 338 to flex in response to a user input force, but may also be sufficiently thick to support the button cap 234.

In one example, the thinned portion 346 may be defined by a button recess 322 defined on an exterior surface 334 of the enclosure 314 and a strain recess 336 defined on an interior surface of the enclosure 314. However, in one embodiment, the button recess 322 may have a larger diameter than the strain recess 336. In this embodiment, the thinned portion 346 may have the smallest thickness at a location corresponding to the position of the force collector 236, which allows the maximum amount of deformation of the flexible member 338 in response to a user force to the button cap 234.

In this embodiment, the button cap 234 may be connected directly to the housing 314 via adhesive 248a, 248b. For example, the adhesive 248a, 248b may be positioned on the recessed surface 342 of the enclosure 314 that defines the floor of the button recess 322.

The strain sensor 244 may be positioned on an interior surface of the thinned portion 346 and flexible member 338.

The strain sensor 244 may be oriented at a positioned that corresponds to the center of the force collector 236 and may experience the force transmitted via the flexible member 338.

In the waterproof button 306 illustrated in FIG. 7, the enclosure 314 may not include an aperture, such that the enclosure may be entirely enclosed, sealing the cavity 230 of the electronic device 100, 200 from water, fluids, and other debris.

The waterproof button 306 of FIG. 7 may operate in a manner substantially similar to the waterproof button 106. However, in this example, the force collector 236 may transmit a user force to the enclosure 314, in particular, the flexible member 338 formed in the thinned portion 346. The flexible member 338 bends in response to the force exerted by the force collector, deforming the strain sensor 244, varying a signal provided by the strain sensor 244 to the processing element.

Figure 8:
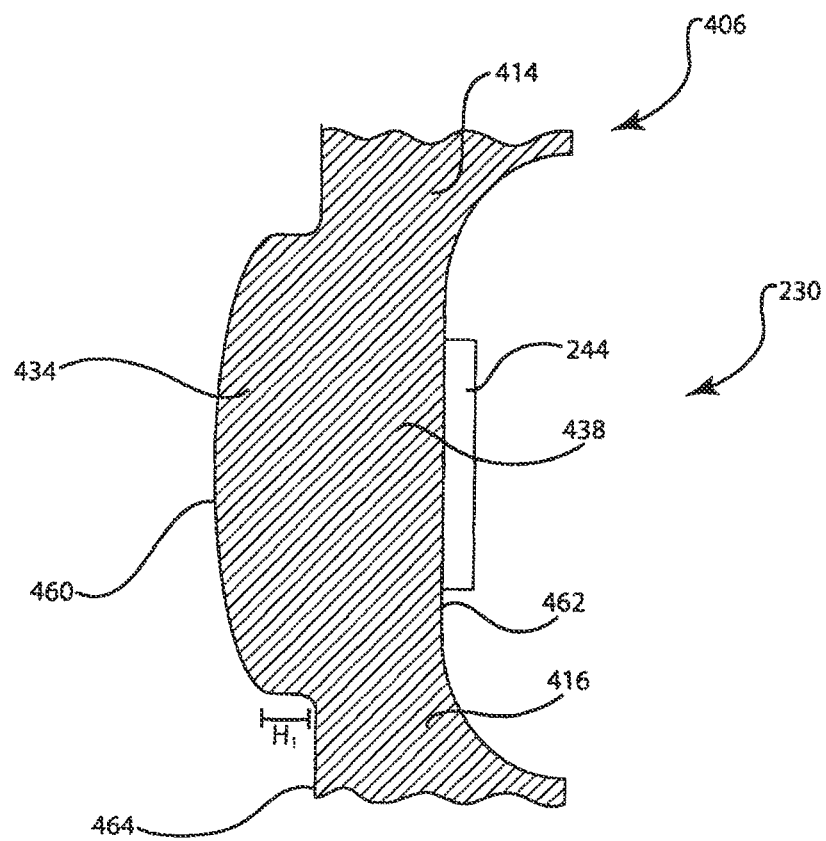
FIG. 8 is a cross-section view of a second example of the waterproof button including an integrally formed button cap and housing.

In other embodiments, the button cap and the flexible member may be integrally formed together. FIG. 8 is a cross-section view of an example of the waterproof button including a button cap integrally formed with the flexible member and enclosure. With reference to FIG. 8, in this embodiment the waterproof button 406 includes an enclosure 414 including the button cap 434 and flexible member 438. For example, the enclosure 414 may include a sidewall and the button cap 434 may extend from the sidewall 416 by a height H such that a top surface 460 of the button cap 434 may be raised relative to a top surface 464 of the enclosure 414. In this embodiment, the enclosure 414 is a single material or component that is formed to include the button cap 434.

In some embodiments button cap 434 may have an increased thickness as compared to the sidewalls 416 of the enclosure 414. Alternatively, an interior surface of the enclosure 414 may be recessed or thinned beneath the button cap 434. In this example, the portion of the enclosure 414 may have an increased flexibility as compared to the sidewalls 416. However, in either embodiment, the button cap 434 portion of the enclosure 414 may be substantially flexible such that it bends due to a user input force. For example, the enclosure 414 may be a plastic, metal, metal alloy, or other material, that may sufficiently flexible to bend due to a user force, but may be rigid enough to protect the internal components for the electronic device 100, 200.

With continued reference to FIG. 8, the strain sensor 244 may be connected to the interior surface 462 of the enclosure 414. In particular, the strain sensor 244 may be connected to the enclosure 414 beneath the button cap 434. The strain sensor 244 may be connected to the portion of the button cap 434 forming the flexible member 438. In other words, the strain sensor 244 may be connected to the portion of the button cap 434 and enclosure 414 that is configured to deform due to a user force. In this example, the interior surface 462 of the enclosure 414 defining the flexible member 438 is configured to bend in response to a user exerting a force against the top surface 460 of the button cap 434.

In the waterproof button 406 of FIG. 8, the enclosure 414 may be completely or substantially sealed from environmental elements. This is because the button cap 434 is formed integrally with the enclosure 414 and thus the enclosure 414 does not require a button aperture or other opening for the button (or components thereof) to be positioned in. By eliminating the requirement for an opening, while still detecting a user input, the waterproof button 406 may be sealed from water or other elements that could harm the internal components of the electronic device 100, 200 typically included in the cavity 230, e.g., processing elements, memory components, and/or sensors.

Figure 9:
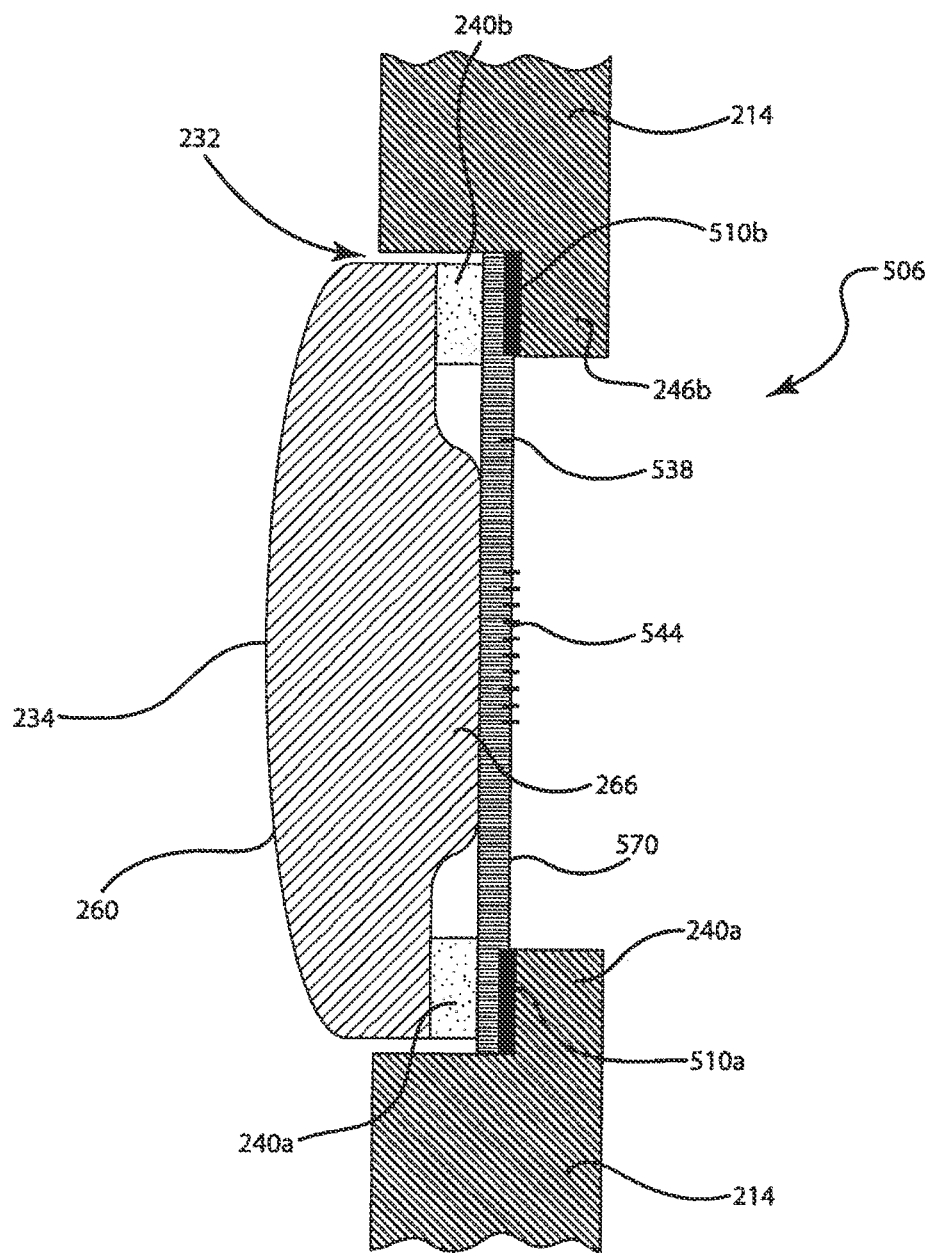
FIG. 9 is a cross-section view of a third example of the waterproof button including a strain sensor deposited directly onto the flexible member.
Figure 10:
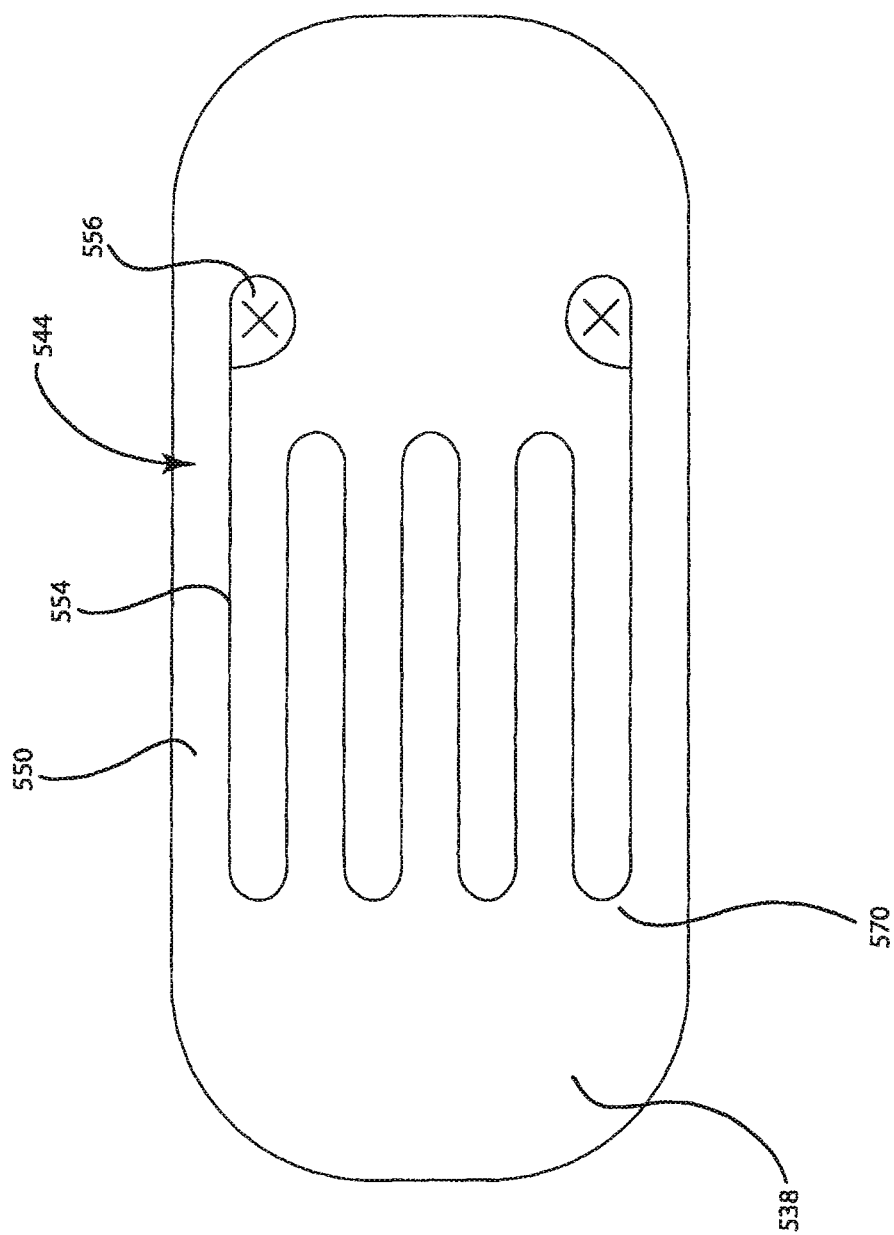
FIG. 10 is a bottom plan view of the flexible member and strain sensor of FIG. 9.

In some embodiments the strain sensor may be directly deposited onto the flexible member. FIG. 9 is a cross-section view of the waterproof button including a strain sensor deposited onto the flexible member. FIG. 10 is an enlarged bottom plan view of the flexible member and strain sensor of FIG. 9. With reference initially to FIG. 9, the waterproof button 506 in this example may be substantially similar to the waterproof button 106 illustrated in FIG. 3. However, in this example, the flexible member 538 may be a material configured to receive electrical traces deposited or plated thereon. As one example, the flexible member 538 may be a plastic material.

With reference to FIG. 9, the flexible member 538 may be connected to the ledges 246a, 246b of the enclosure 214 through one or more attachment elements 510a, 510b. In this example the attachment elements 510a, 510b may connect the edges of the flexible member 538 to the top surface of the ledges 246a, 246b. However, in other embodiments, the attachment elements 510a, 510b may be connected in other manners to the flexible element 538 and/or enclosure 214.

In some embodiments, the attachment elements 510a, 510b may further act to seal the cavity 230. For example the attachment elements 510a, 510b may seal the space between the edges of the flexible element 538 and the top surface of the ledges 246a, 246b. As one example, the attachment elements 510a, 510b may be adhesive, bonding points (e.g., ultrasonic welding or chemical bonding) and the elements 510a, 510b act to substantially prevent water and other elements from entering into the cavity 230 through the button aperture 232.

With reference to FIGS. 9 and 10, in this embodiment, the strain sensor 544 includes a strain gauge 550 having a strain sensitive pattern 554 and one or more terminals 556. The strain gauge 550 may be substantially similar to the strain gauge 250 illustrated in FIG. 5. However, in this example, the strain sensitive pattern 554 and terminal 556 may be deposited onto the bottom surface 570 of the flexible member 538. In other words, a substrate or flex circuit connecting the strain gauge to the flexible member may be omitted.

The strain gauge 550 may be deposited onto the bottom surface 570 of the flexible member 538 in a number of different manners, such as, but not limited to, laser direct structuring, electrical plating, or the like. Additionally, the terminals 556 may also function as attachment points to connect the strain gauge 550 to the flexible member 538. For example, the terminals 556 may include solder points or spring fingers that connect the strain gauge to the flexible member 538. In some instances, the connection points for the strain gauge, such as the solder points or spring fingers, may be connected to portions of the flexible element 538 that may not bend or may not bend significantly.

Figure 11:
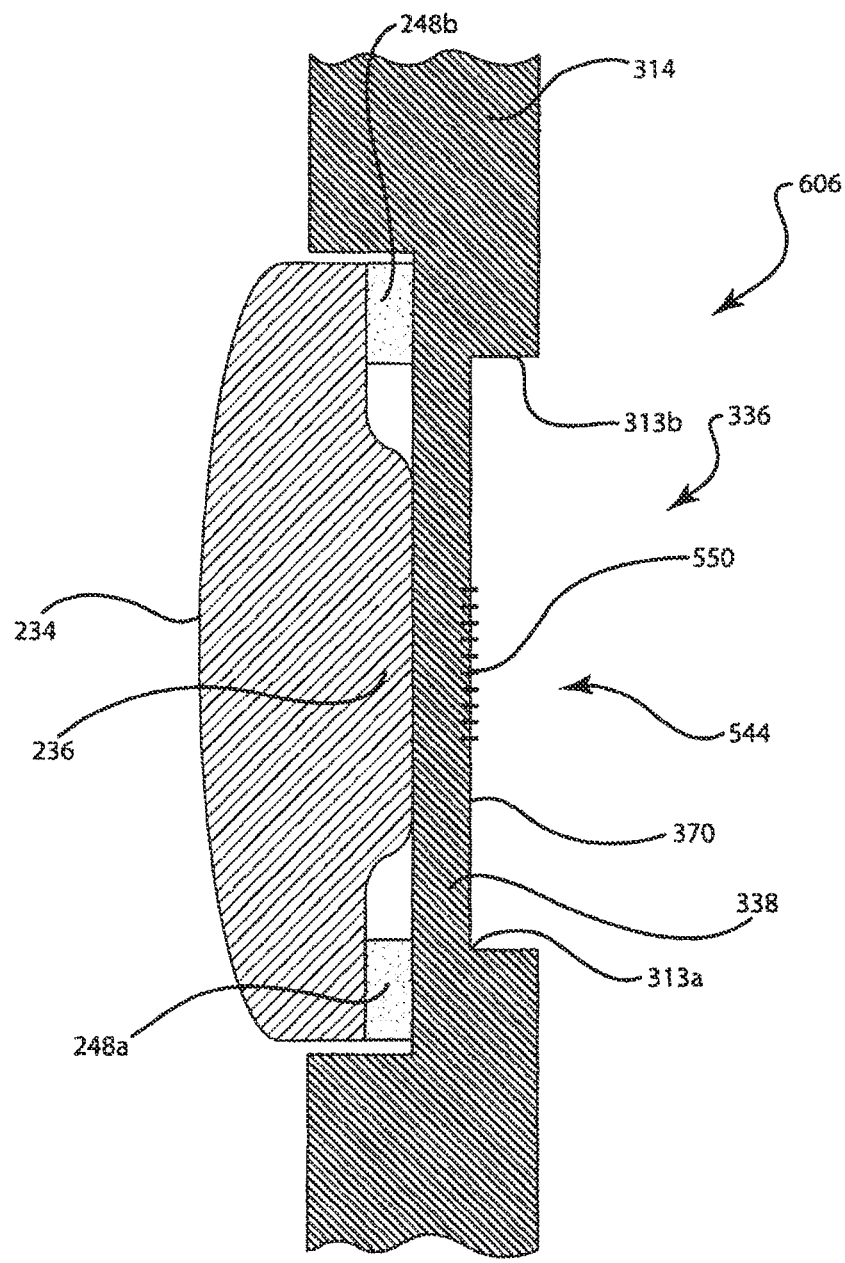
FIG. 11 is a cross-section view of a fourth example of the waterproof button including an integrally formed flexible member and housing with the strain sensor deposited directly on the housing.

In some examples, the strain sensor may be deposited directly onto the enclosure of the electronic device. FIG. 11 is a cross-sectional view of the waterproof button including the strain sensor connected directly to the enclosure. With reference to FIG. 11, in this embodiment the waterproof button 606 may be substantially similar to the waterproof button 306 illustrated in FIG. 7. In particular, the waterproof button 606 may include a flexible member 338 formed integrally with the enclosure 314. However, in this example, the flexible member 338 may be a material where conductive trances can be deposited or otherwise formed directly thereon. For example, the enclosure 314 and the flexible member 338 may both be plastic.

As shown in FIG. 11, the strain sensor 544 may include the strain gauge 550 including the strain sensitive pattern that is deposited directly onto the bottom surface 370 of the flexible member 338, which in this instance is formed integrally with the enclosure 314. The strain sensor 544 may be substantially similar to the strain sensor 544 illustrated in FIG. 10 and may be deposited on the enclosure 314 through laser direct structuring, plating techniques, or the like.

With continued reference to FIG. 11, in some embodiments, the enclosure 314 may include beveled edges 313a, 314b as it transitions from a support portion to the flexible member 338. In particular the sidewalls boarding the sensor recess 336 may be angled as they transition to the flexible member 338.

Figure 12:
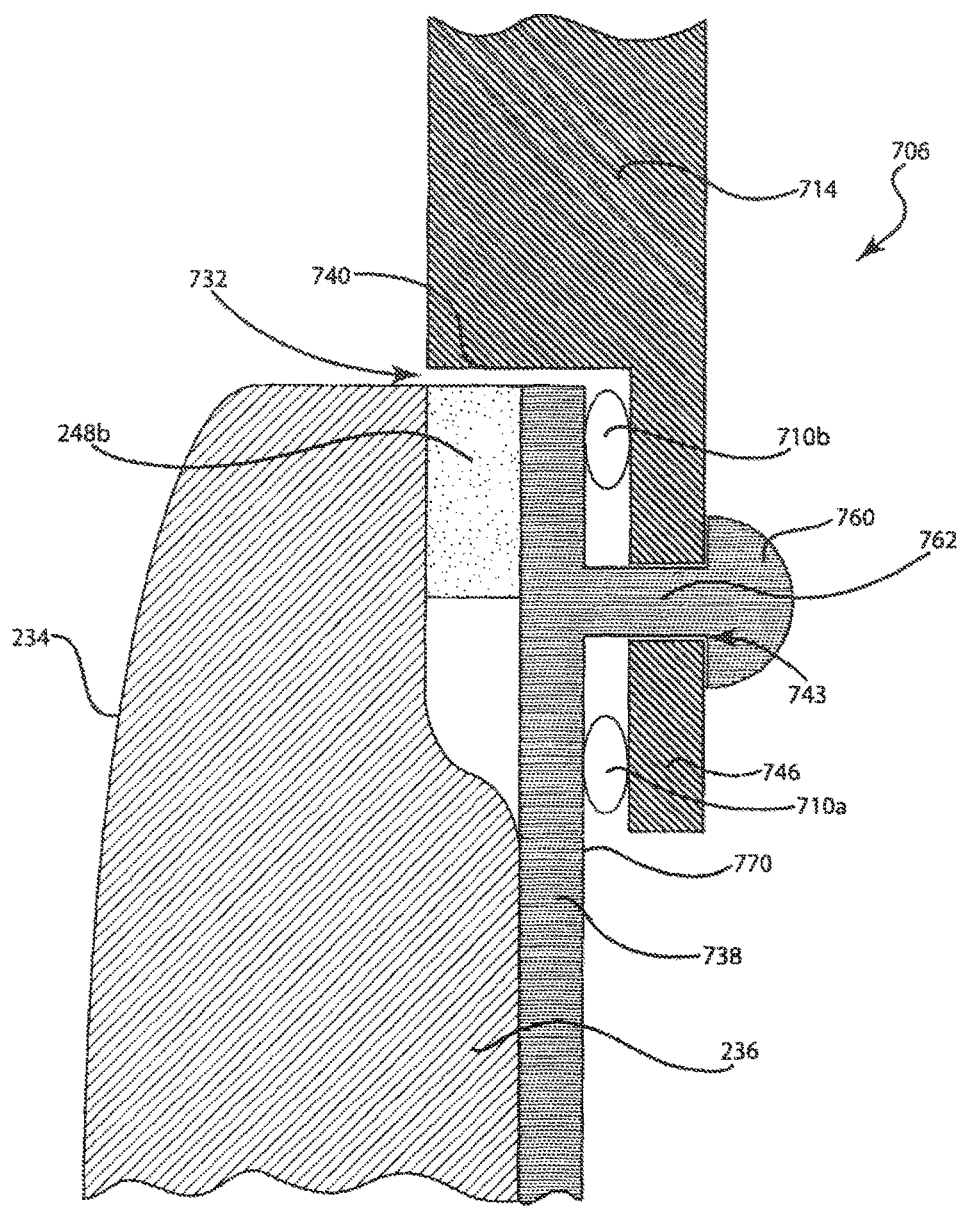
FIG. 12 is an enlarged cross-section view of a fifth example of the waterproof button including a fastening element for connecting the flexible member to the housing.

In some embodiments, the flexible member may connect to the enclosure through a fastening element or bonding element that extends through an aperture in the enclosure. FIG. 12 is an enlarged cross-section view of a waterproof button including a connection element for connecting the flexible member to the enclosure. With reference to FIG. 12, the waterproof button 706 may be substantially similar to the waterproof button illustrated in FIGS. 3 and 9. However, in this example, the enclosure 714 may include a boss aperture 743 defined through a ledge 746. In particular the enclosure 714 may include one or more sidewalls 740 defining the top portion of a button aperture 732 and the ledge 746 may extend from each of the sidewalls 740. The ledge 746 may be recessed from the exterior surface of the enclosure 714 to define a button recess for the button assembly to sit. The ledge 746 (as shown in FIGS. 3 and 9 with reference to the ledges 246a, 246b) may terminate prior to reach the center of the button aperture 732.

With continued reference to FIG. 12, the flexible element 738 may include two securing posts 762 that extend from opposing ends thereof. Each securing post 762 may extend from a button surface 770 of the flexible member 738 and may include a rivet head 760 attached to a terminal end. The rivet head 760 may have a larger diameter than the post 762 the rivet head 760 acts to secure the flexible member 738 to the enclosure 714, and in particular, to the ledge 746.

In this embodiment, the flexible element 738 may be positioned on a top surface of the ledge 746 and the post 762 may be received through the boss aperture 743. Once the post 762 extends through the boss 743, the rivet head 760 may be formed or connected to the terminal end of the post 762. For example, the rivet head 760 may be formed through a heat staking process and the boss or post 762 may be heated and the compressed (e.g., stamped) causing the material to flow outwards expanding the diameter of the end of the post. Once the rivet head 760 is formed, the head 760 seals against the bottom surface of the ledge 746 to seal the boss aperture 743, as well as prevent the post 762 from being removed from the boss aperture 743.

Additionally, with continued reference to FIG. 12, the waterproof button 706 may include a sealing element 710, such as an O-ring. In this embodiment, the sealing element 710 may be received around the post 720 and seals against the top surface of the ledge 746 and the bottom surface of the flexible member 738. The sealing element 710 prevents water from reaching the boss aperture 743 to better seal the button 706. In some implementations, the flexible element 738 is configured to continuously compress the sealing element 710. As an example, once the rivet head 760 is formed, the head 760 may forces the flexible element 738 against the ledge 746 of the enclosure 714, which acts to compress the sealing element 710, ensuring a tight seal between the sealing element 710 and the upper surface of the ledge 746.

Figure 13:
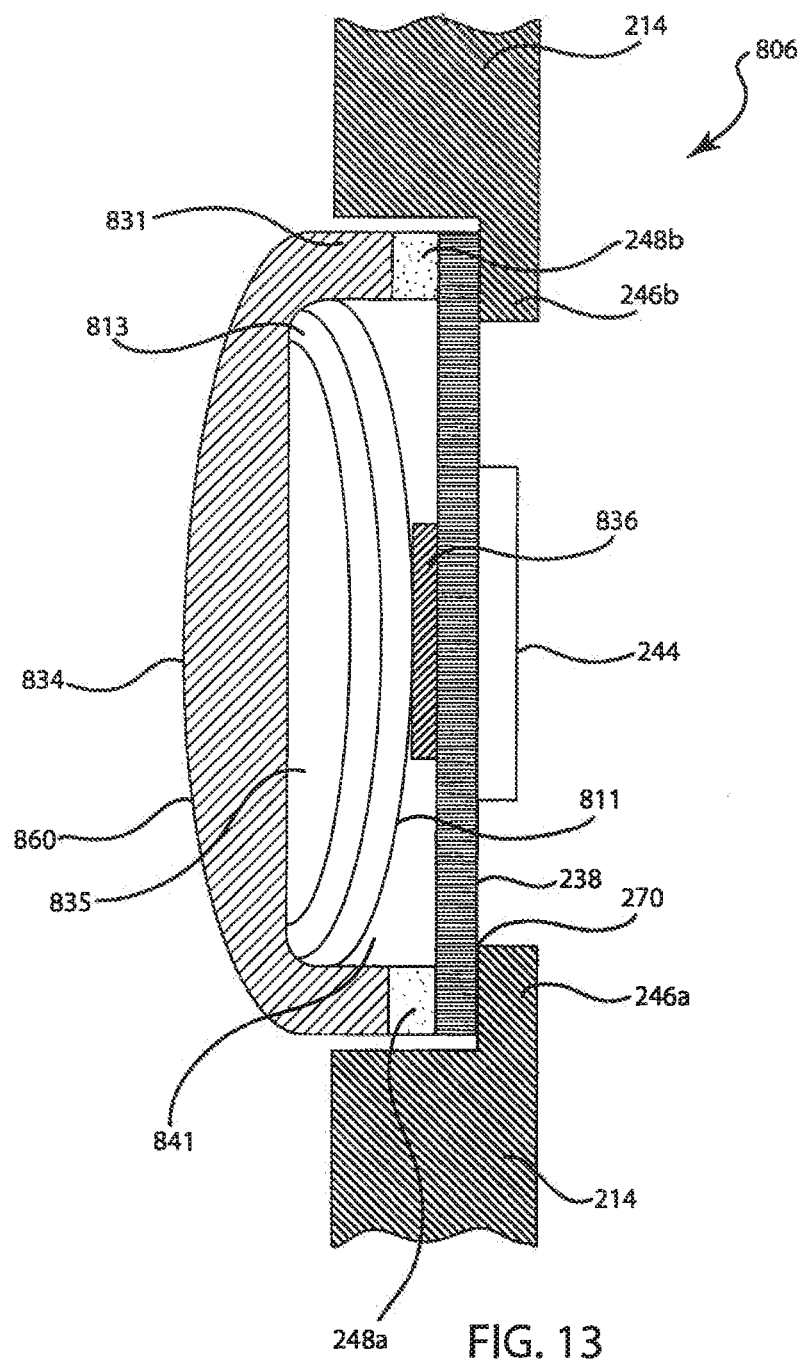
FIG. 13 is a cross-section view of a sixth embodiment of the waterproof button including a feedback element.

In some embodiments, the waterproof button may include a feedback mechanism to provide tactile feedback to a user. FIG. 13 is a cross-section view of the waterproof button including a feedback mechanism. With reference to FIG. 13, the waterproof button 806 may be substantially similar to the waterproof button 106 but may include a feedback element 835. In particular, button 806 may include a feedback element 835, such as a collapsible dome or tactile element that provides a tactile feedback when the button cap 834 is compressed.

In some examples, the feedback element 835 may be an inverted dome with a base 813 connected to an interior surface of the button cap 834 and a top 811 connected to a force collector 836. In this manner, the force collector 836 may form an extension from the top 811 of the feedback element 835. The feedback element 835 may be sufficiently flexible so as to collapse when a user presses down on the button cap 834, but may have sufficient rigidity to provide a tactical feel as it compresses.

In this embodiment, the button cap 834 may include a top surface 860 and two legs 831 extending downwards therefrom. The button cap 834 forms a user engagement surface and a user may compress the button cap 834 to activate the button 806. The legs 831 of the button cap 834 are connected to a top surface of the flexible member 238 by the adhesive 248a, 248b or other connection mechanism. When connected to the flexible member 238, the button cap 834 and flexible member 238 may define a feedback cavity 841 and the feedback element 835 may be received therein.

In operation, the user may press on the top surface 860 of the button cap 834 to compress the button cap 834 towards the enclosure 214. As the button cap 834 experiences a force, the interior surface of the cap 834 exerts a force on the base 813 of the feedback element 835, causing the feedback element 835 to compress towards its top 811. The user experiences the collapsing of the feedback element 835 as haptic feedback corresponding to the selection of the button. As the button cap 834 compresses, the cap 834 transfers the force to the force collector 836, which transmits the force to the flexible member 238. As with other embodiments, as the force collector 836 exerts a force on the flexible member 238, the flexible member 238 deforms, causing the strain sensor 244 to register the deformation and provide a signal corresponding to the user input.

Figure 14:
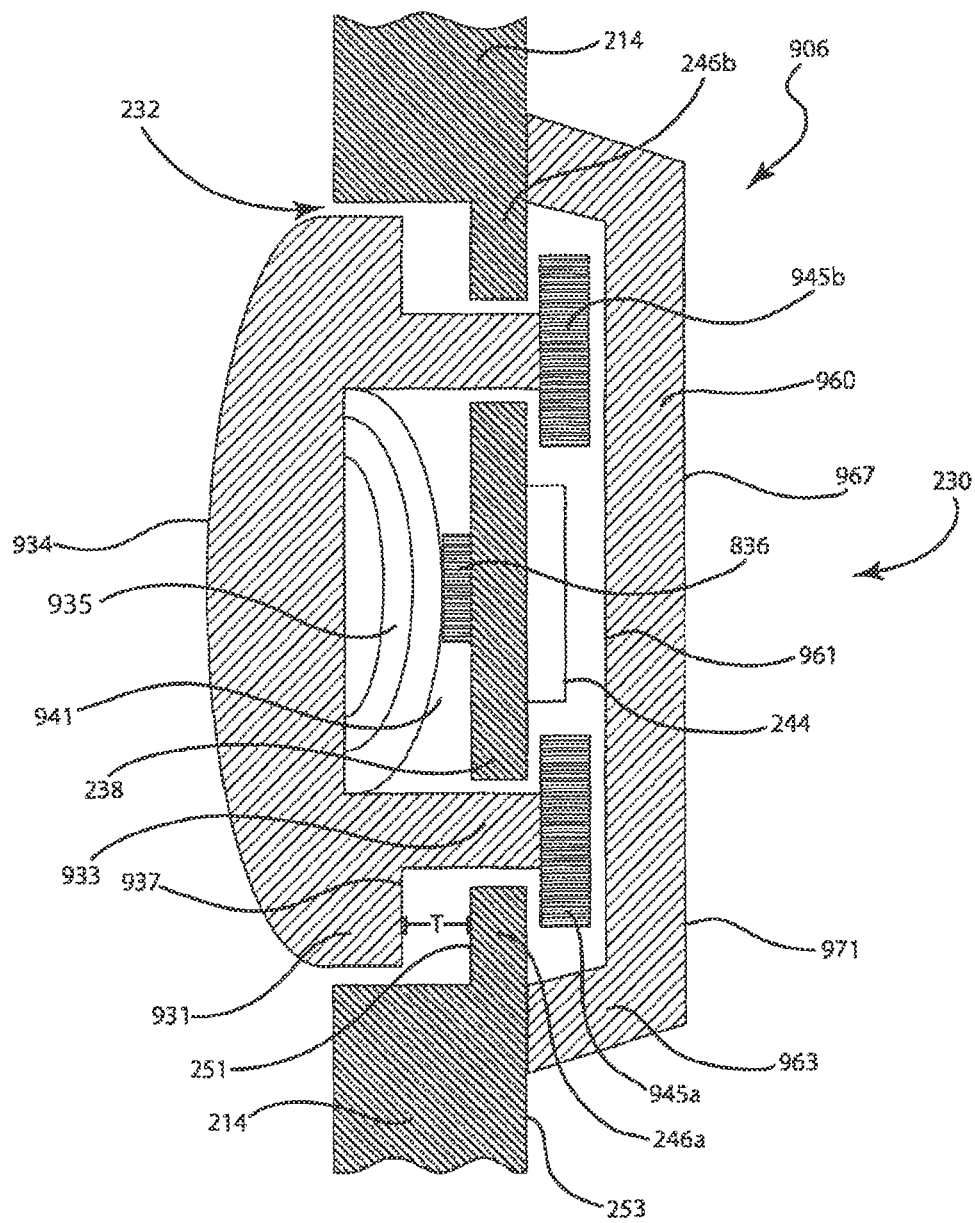
FIG. 14 is a cross-section view of a seventh embodiment of the waterproof button including a sealing member.

In some embodiments, the waterproof button may include a sealing member positioned on an interior of the enclosure. FIG. 14 is a cross-section view of the waterproof button including a sealing member. With reference to FIG. 14, in this embodiment, the waterproof button 906 may be substantially similar to the waterproof button 106 shown in FIG. 3, but may include a sealing member 906 connected to an interior surface 253 of the enclosure 214. Additionally, the button cap 934 may include a structure that may be varied as compared to other embodiments.

As shown in FIG. 14, in some embodiments, the button cap 934 may include a head 932 defining the top surface of the button cap 934 and two legs 933 that extend from the head 932. The legs 933 may be positioned inwards from a terminal outer edge of the button cap 934, such that the button cap 934 may have a mushroom-like shape. The button cap 934 may define a cavity 941 or recess between the legs 933 that extends partially into the head 931. The cavity 941 is configured to receive the feedback element 935.

The sealing member 960 may be a plate or other member and may include a main body 971 having two sidewalls 963 extending at an angle from either end of the main body 971. In some embodiments, the sealing member 906 may be circular or oval shaped and there may be a single sidewall 963 that extends around the entire perimeter of the main body 971. The sealing member 960 may be substantially water impermeable and may prevent water from traveling therethrough.

With continued reference to FIG. 14, assembly of the waterproof button 906 will now be discussed in more detail. The legs 933 of the button cap 934 are inserted into the button aperture 232 and may be positioned adjacent or substantially adjacent to the terminal end of each ledge 246a, 246b of the enclosure 214. The ends of the legs 933 that extend through the button aperture 232 may be connected to retaining features 945a, 945b. The retaining features 945a, 945b are positioned on an interior side of the enclosure 214 within the cavity 230. The retaining features 945a, 945b act to secure the legs 933 to the enclosure 214, while also allowing the button a cap 934 to travel a predetermined distance. As an example, the retaining features 945a, 945b may be spring members or resilient members that allow the button cap to compress due a user force and spring back to its original location.

The flexible member 238 and strain sensor 244 are positioned between each of the legs 933 of the button cap 934 and connected to the retaining features 945a, 945b and/or enclosure 214 to be secured in position. The feedback element 935 and/or force collector 836 may be received within the button cavity 941 and aligned with the flexible member 238. In these embodiments, the feedback element 935 may be positioned in a non-waterproof area of the button. In particular, in this embodiment of the waterproof button 906, the button cap 934 and button aperture 23 may not be sealed from the exterior environment and the dome or other feedback element 935 may exposed to certain elements, such as water. However, in these embodiments, the feedback element 935 may be a tactile or other mechanically based device and may not be used to provide an electrical signal to the processing element, and so may be exposed to certain elements, such as water, without being damaged.

In some embodiments, the bottom surface 937 of the head 931 may be positioned above a top surface 251 of the ledges 246a, 246b by a travel height of T. The travel height T defines the travel distance that the button cap 934 may travel when compressed by a user. The travel height T may be determined in part by the retaining members 945a, 945b and in particular the flexibility of the retaining members 945a, 945b.

With continued reference to FIG. 14, the sealing member 960 is connected to the interior surface 253 of the enclosure 214. The main body 971 of the sealing member 960 may be at least a long as a separation distance between each of the legs 933 of the button cap 934 and corresponding retaining members 945a, 945b. In other words, the sealing member 960 is configured to enclosure the button cap assembly and its corresponding connections to the enclosure 214. This may help to prevent water or other elements that enter through the button aperture 232 from entering into the cavity 230.

In particular, the top surface of the sidewall 963 of the sealing member 960 seals against the interior surface 253 of the enclosure 214. The sidewall 963 may be connected to the enclosure 214 by adhesive, laser welding, adhesive, or the like. The sealing member 960 seals the cavity 230 from the button aperture 232. FIG. 15 is a bottom plan view of the sealing member connected to the enclosure. With reference to FIGS. 14 and 15, the bottom surface 967 of the sealing member 960 may include a communication aperture 977. The communication aperture 977 may allow one or more communication elements, such as a flex chip connector, wires, or the like, to extend from the strain sensor 244 to the processing element. The flex connector or strain communication elements may extend through the aperture 977 and adhesive 979 or other sealing element may then be injected into the aperture 977, sealing the aperture 977 and the communication elements.

In the various embodiments described herein, the waterproof button may substantially prevent water, fluids, and other elements, such as debris, etc., from being transmitted from an environment of the electronic device 100, 200 into a cavity defined within the housing of the electronic device 100, 200. Additionally, the waterproof button may be activated, e.g., compressed or selected by a user, under water without allowing water to be transmitted into the enclosure cavity of the device, while still being able to register a user input signal. In many conventional buttons that include a seal to prevent water ingress, such as a rubber membrane or plunger, the button may not be activated or pressed underwater without damaging the seal. On the contrary, the waterproof button disclosed herein may be pressed while underwater, without allowing the ingress of water and the waterproof button can function while under pressure. As an example, even as the electronic device experiences pressure, such as water pressure, the waterproof button may prevent water from entering into the cavity of the electronic device.

CONCLUSION

The foregoing description has broad application. For example, while examples disclosed herein may focus on a wearable electronic device, it should be appreciated that the concepts disclosed herein may equally apply to substantially any other type of electronic device. Similarly, although the input button may be discussed with response to a compressible button, the devices and techniques disclosed herein are equally applicable to other types of input structures. Accordingly, the discussion of any embodiment is meant only to be exemplary and is not intended to suggest that the scope of the disclosure, including the claims, is limited to these examples.

What is claimed is:

1. An electronic device comprising:
   an enclosure defining an interior;
   a button connected to the enclosure, the button comprising:
   a button cap defining a user input surface;
   a flexible member separating the interior of the enclosure from an external environment and having an interior surface facing the interior of the enclosure and exterior surface facing the external environment, the flexible member being aligned with the button cap and connected thereto; and
   a strain sensor connected to the interior surface of the flexible member; and a processing element in communication with the strain sensor; wherein when a force is exerted on the button cap, the flexible member bends; and
   the strain sensor detects a user input corresponding to the force and provides a signal to the processing element corresponding to the user input.

2. The electronic device of claim 1, wherein the button cap further comprises a force collector extending from a bottom surface, wherein the force collector aggregates the force and transmits the force to the flexible member.

3. The electronic device of claim 2, wherein the button cap and the force collector are integrally formed.

4. The electronic device of claim 1, wherein the flexible member and the button cap are integrally formed.

5. The electronic device of claim 1, wherein the button is waterproof.

6. The electronic device of claim 1, wherein the flexible member is integrally formed with the enclosure.

7. The electronic device of claim 1, wherein the strain sensor comprises a strain gauge defining a strain sensitive pattern and at least one communication terminal.

8. The electronic device of claim 1, wherein the flexible member is metal or plastic.

9. A waterproof button comprising:
   a button cap configured to move between a first position and a second position;
   an at least partially flexible metal plate aligned with the button cap; and
   a strain sensor directly connected to a first surface of the flexible metal plate, the strain sensor comprising:
   a flexible circuit; and
   a strain gauge connected to the flexible circuit; wherein
   the flexible metal plate bends in response to a user input force applied to the button cap in a direction that the user input force is applied, deforming the flexible circuit and the strain gauge.

10. The waterproof button of claim 9, further comprising a force collector connected to the button cap and positioned between the button cap and the flexible metal plate.

11. The waterproof button of claim 10, wherein the force collector is integrally formed with the button cap and aggregates the user input force applied to the button cap.

12. The waterproof button of claim 9, further comprising an enclosure at least partially surrounding the button cap, wherein the flexible metal plate is welded to the enclosure.

13. The waterproof button of claim 9, further comprising a housing defining a button aperture, wherein the button cap is received through button aperture, wherein the housing is integrally formed with the flexible metal plate.

14. The waterproof button of claim 9, further comprising a feedback element connected to the button cap and configured to provide feedback to a user.

15. The waterproof button of claim 14, wherein the feedback element is a collapsible dome received within a recess defined by the button cap.

16. A wearable electronic device including the waterproof button of claim 9.

17. A waterproof button for an electronic device comprising:
   a user input element;
   a flexible member aligned with the user input element; and
   a strain sensor defined on the flexible member, the strain sensor comprising a strain gauge; wherein
   the strain sensor is deposited directly onto a first surface of the flexible member; and
   the user input element is coupled to a second surface of the flexible member opposite the first surface.

18. The waterproof button of claim 17, wherein the strain sensor is deposited on the flexible member through laser direct structuring or plating.

19. The waterproof button of claim 17, where the flexible member is plastic.

20. The waterproof button of claim 17, wherein the user input element is a button.

\* \* \* \* \*